United States Patent [19]

Godinho et al.

[11] Patent Number: 5,168,076

[45] Date of Patent: Dec. 1, 1992

[54] METHOD OF FABRICATING A HIGH RESISTANCE POLYSILICON LOAD RESISTOR

[75] Inventors: Norman Godinho, Los Altos Hills; Frank T. Lee, Monte Sereno; Hsiang-Wen Chen, Cupertino; Richard F. Motta, Los Altos; Juine-Kai Tsang, Palo Alto; Joseph Tzou, Belmont; Jai-man Baik, San Jose; Ting-Pwu Yen, Fremont, all of Calif.

[73] Assignee: Paradigm Technology, Inc., San Jose, Calif.

[21] Appl. No.: 724,008

[22] Filed: Jul. 1, 1991

Related U.S. Application Data

[62] Division of Ser. No. 464,094, Jan. 12, 1990.

[51] Int. Cl.[5] ............................................. H01L 21/70
[52] U.S. Cl. ..................................... 437/60; 437/47; 437/918; 148/DIG. 136
[58] Field of Search ................... 437/60, 47, 918, 190, 437/191, 193, 200, 51, 60, 47; 148/DIG. 136

[56] References Cited

U.S. PATENT DOCUMENTS

| | | | |
|---|---|---|---|
| 4,329,706 | 5/1982 | Crowder | 437/191 |
| 4,774,203 | 9/1988 | Ikeda et al. | 437/60 |
| 4,835,118 | 5/1989 | Jones, Sr. et al. | 437/191 |
| 4,903,096 | 2/1990 | Masuoka et al. | 357/51 |
| 4,931,411 | 6/1990 | Tigelaar et al. | 437/47 |
| 5,013,678 | 5/1991 | Winnerl et al. | 437/47 |
| 5,013,686 | 5/1991 | Choi et al. | 437/47 |
| 5,037,766 | 8/1991 | Wang | 148/DIG. 136 |

FOREIGN PATENT DOCUMENTS

| | | | |
|---|---|---|---|
| 0173245 | 3/1986 | European Pat. Off. | |
| 0290164 | 12/1987 | Japan | 437/918 |
| 0290166 | 12/1987 | Japan | 437/191 |

OTHER PUBLICATIONS

IEEE VLSI Multilevel Interconnection Conference, Jun. 1986, pp. 530-536; N. McIntyre et al. entitled "Self Aligned Silicide Interconnection . . . ".
Journal of Vacuum Science and Technology: Part A, No. 4, 1987, pp. 2184-2189; E. O. Ristolainen et al. entitled "A Study of Nitrogen-Rich . . . ".
IEEE Transactions on Electron Devices, vol. 36, No. 9, Sep. 1989, pp. 1657-1662; M. Minami et al. entitled "A New Soft-Error-Immune Static . . . ".
IEEE Transactions on Electron Devices, vol. 35, No. 3, Mar. 1988, pp. 298-301; R. Saito et al. entitled "A Novel Scaled-Down Oxygen-Implanted . . . ".

Primary Examiner—Brian E. Hearn
Assistant Examiner—Michael Trinh
Attorney, Agent, or Firm—Skjerven, Morrill, MacPherson, Franklin & Friel

[57] ABSTRACT

A load resistor for use in a semiconductor integrated circuit consists of two portions of conductive material, typically strips of either a silicide or a composite polycrystalline silicon layer and silicide layer formed thereon, formed on a semiconductor substrate and separated from each other by a selected distance. An electrically conductive dopant diffusion barrier is formed on the first and second portions of conductive material. A polycrystalline silicon material is then placed on the structure such that one portion of the polycrystalline silicon material is in ohmic contact through the diffusion barrier with the first portion of conductive material and the other portion of the polycrystalline silicon material is in ohmic contact through the diffusion barrier with the second portion of conductive material. Typically the polycrystalline silicon material is placed on an insulation layer formed on the semiconductor substrate in the portion of the substrate between the two portions of conductive material. The diffusion barrier prevents any dopant from the conductive material from diffusing into the polycrystalline silicon material thereby allowing the polycrystalline silicon material to function as a load resistor having a high resistance in the giga-ohms range. Subsequent high temperature processing of the structure does not change the resistance of the polycrystalline silicon because the dopant diffusion barrier prevents any dopant from the underlying conductive material from diffusing into the polycrystalline silicon material.

7 Claims, 11 Drawing Sheets

METHOD OF FABRICATING A HIGH RESISTANCE POLYSILICON LOAD RESISTOR this application is a division of application Ser. No. 07/464,094, filed Jan. 12, 1990.

RELATED APPLICATION

This application is related to and incorporates by reference copending application Ser. No. 07/464,496 filed the same day as this application. This copending application is also filed by Norman Godinho, Frank Tsu-Wei Lee, Hsiang-Wen Chen, Richard F. Motta, Juine-Kai Tsang, Joseph Tzou, Jai-man Baik, and Ting-Pwu Yen entitled "Self Aligning Contact and Interconnect Structure", and is assigned to Paradigm Technology Corporation the assignee of this application.

FIELD OF THE INVENTION

This invention relates to a high resistance polysilicon load resistor structure which, due to the extremely small size of the load resistor, allows high density implementation of integrated circuits, such as CMOS static random access memories, using a load resistor or resistors.

BACKGROUND OF THE INVENTION

A static random access memory (SRAM) cell can consist of four N-channel transistors and two high value pull-up resistors, also referred to as load resistors. In the prior polysilicon (for example, approximately three microns long) defined as part of a second polysilicon layer formed on, but separated by insulation from at least part of, a first doped polysilicon layer. The portions of the second polysilicon layer adjacent to the undoped length are implanted with arsenic or phosphorous to lower their resistances to 100-200 ohms per square. However, subsequent heat treatments cause the dopants to diffuse laterally into the undoped polysilicon load resistor thereby reducing its effective length. This causes its resistance to drop and the cell current to increase significantly. Alternatively, another type of polysilicon resistor involves the deposition of polysilicon directly onto the doped silicon substrate. Depending on the nature of the grain boundaries of the polysilicon, the dopant in the silicon substrate can diffuse rapidly through the polysilicon resistor, rendering it useless as a high value pull-up resistor.

In the prior art, the problem of resistor failure caused by dopant diffusion has been overcome by making polysilicon load resistors excessively long. As much as one micron on either end of the undoped three micron long portion of the polysilicon is allowed for the lateral diffusion of dopants, leaving approximately one micron or less of intrinsic undoped silicon in the middle that ultimately acts as a high resistance resistor on the order of many giga-ohms. In conventional static random access memory processes, the three micron load resistor length has put a severe limitation on cell size reduction.

SUMMARY OF THE INVENTION

In accordance with this invention, a load resistor only one micron long or less is provided which allows increased packing density of components using load resistors in integrated circuits compared to the prior art, and which particularly makes possible smaller sizes than heretofore achieved in static random access memory cells.

In accordance with this invention a polysilicon high resistance resistor is fabricated by using two portions of conductive material, such as a silicide typically formed from two portions, typically though not necessarily strips, of polycrystalline silicon, separated by a selected distance. On the two separated portions of conductive material are formed dopant barriers which are electrically conductive. On the dopant barriers and over the area between the two portions of conductive material is deposited a thin oxide layer. Vias are opened through this oxide to the two underlying portions of conductive material and then a second layer of polycrystalline silicon of the shape desired for the high resistance load element (typically to be used in an SRAM cell) is formed over the vias and the oxide between the two portions of silicide. The two ends of this second layer of polycrystalline silicon are electrically connected to the underlying two portions of conductive material through the electrically conductive dopant barrier. However, the dopant barrier prevents any dopant in the underlying portions of conductive material from diffusing into the second layer of polycrystalline dopant from the two underlying portions of conductive material is unable to transfer to the high resistivity overlying polycrystalline silicon layer, the electrical resistance of the load resistor formed from this overlying polycrystalline silicon layer does not appreciably change during subsequent high temperature processing.

The two portions of conductive material are typically silicide formed from undoped polycrystalline silicon. However, the undoped polycrystalline silicon from which these conductive portions are formed is itself often in contact with still another underlying layer of polycrystalline silicon which typically is doped. Consequently dopant from the underlying layer of polycrystalline silicon may, under certain circumstances, diffuse into the conductive material. In accordance with this invention the conductive material is preferably a silicide. Dopant in silicide diffuses very rapidly during high temperature processing. between the silicide and the overlying polycrystalline silicon are essential to prevent any dopant in the silicide from traveling into the high resistance load element, thereby changing its resistance.

The resistance of the load resistor is defined by the selected distance separating the two conductive portions of silicide and the thickness and width of the polycrystalline silicon forming the resistive element. Thus, the load resistor is formed from that portion of the polycrystalline silicon layer between the two underlying but separated conductive portions of silicide.

In one embodiment a via is formed in the oxide overlying each conductive portion of silicide and the load resistor is formed by the deposition of a polycrystalline silicon layer over the two conductive portions of silicide. The deposited polycrystalline silicon covers each of these "load resistor vias". The polycrystalline silicon contacts a titanium nitride cap formed in each via over the underlying silicide. The underlying silicide often covers at least in part or is in contact with an underlying doped silicon or polysilicon layer which may also have silicide on its top. Titanium nitride is both an electrical conductor and a barrier to dopant diffusion from the underlying doped silicon layer to the polysilicon resistor. Thus dopants are blocked from diffusing into the load resistor by the titanium nitride barrier, which at the same time provides intimate electrical contact between the load resistor and the underlying silicide. Since the dopants are blocked from diffusing into the polysilicon resistor, the length of this resistor will not decrease during subsequent high temperature processing and this resistor can initially be made very short. Consequently it is not necessary to provide extra resistor length to achieve the proper resistance, as is done in the prior art. As a result, the size of circuitry, such as an SRAM cell, using the resistor of this invention, is considerably reduced compared to the size of functionally identical circuitry in the prior art.

DETAILED DESCRIPTION

Figure 1B:
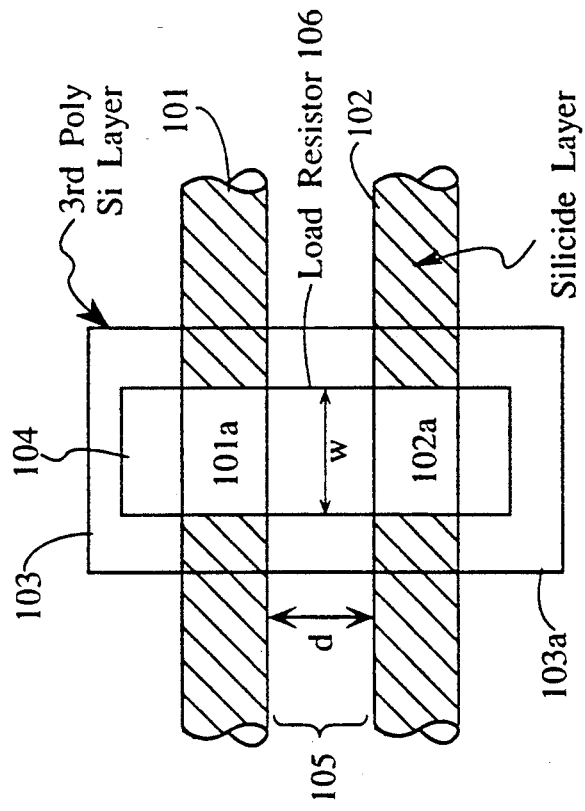
FIG. 1b shows in plan view the load resistor of this invention.
Figure 1A:
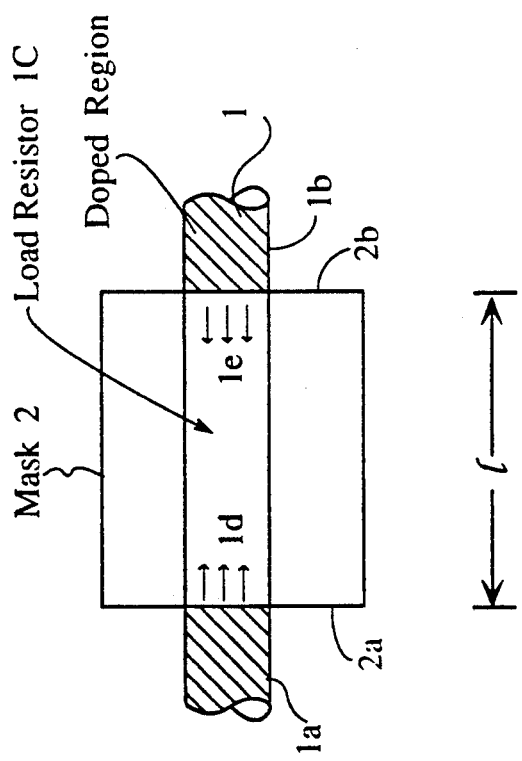
FIG. 1a shows in plan view a typical prior art load resistor for use in a static RAM cell.

FIG. 1a illustrates the conventional prior art static RAM load resistor structure formed using doped polycrystalline silicon. As shown in FIG. 1a, a polysilicon strip 1 is formed on a semiconductor substrate and then a mask 2 (typically photoresist) is formed over the portion 1c of polycrystalline silicon strip 1 to comprise the load resistor Mask 2 is defined such that edges 2a and 2b define respectively the initial left and right limits of the to-be-formed load resistor 1c. Following formation of mask 2, dopant is placed in regions 1a and 1b of the polycrystalline silicon 1 in a well-known manner, typically by ion implantation. The problem with the structure of FIG. 1a is that during subsequent high temperature processing of the wafer of which load resistor 1c is a part, dopant diffuses into the load resistor 1c in the directions shown by arrows 1d and 1e. Thus the final resistance of load resistor 1c is very sensitive to the temperature and duration of the high temperature processing of the wafer subsequent to the placement of dopant in portions 1a and 1b of polycrystalline silicon 1. So long as the length of region 1c is long relative to the distance impurities diffuse from regions 1a and 1b into region 1c, the lateral diffusion of these impurities has only a small effect on the resistance of the load resistor 1c. As the length of region 1c becomes smaller, the uncertainty in the resistor value of region 1c due to lateral dopant diffusion becomes greater. In fact in submicron line widths, punch-through of the dopant from regions 1a and 1b is a distinct problem. Due to the grain boundaries between the various crystals making up the polycrystalline silicon, the diffusion of dopant into region 1c from regions 1a and 1b of the polycrystalline silicon occurs at a much greater rate (i.e. in the range of an order of magnitude faster) than the diffusion of the same dopant in single crystal silicon. Accordingly, the reduction in resistance of resistor 1c due to this lateral diffusion of impurities becomes quite large as the length 1 of region 1c approaches or becomes less than two microns. The actual reduction in resistance of resistor 1c due to this lateral diffusion is a function of the high temperature processing subsequent to the formation of this resistor, as well as the grain size of the polysilicon grains which make up this resistor and the particular dopant in the resistor.

The load resistor according to this invention, illustrated in FIG. 1b overcomes this problem. As shown in FIG. 1b, two conductive strips 101 and 102, typically titanium silicide, are formed on an insulating layer which in turn is formed on an underlying semiconductor substrate. Strips 101 and 102 are either totally silicide or a top layer of silicide overlying a bottom layer of polycrystalline silicon. Over the silicide 101, 102 are formed a titanium nitride layer and an oxide layer. Then vias 101a and 102a are formed in the oxide to selectively expose portions of the titanium nitride on the underlying silicide strips 101 and 102. Alternatively, oxide can be formed directly over silicide 101, 102 without the intervening layer of titanium nitride. Then the titanium nitride cap is selectively formed on those portions of silicide 101, 102 exposed by vias 101a and 102a.

A layer of polycrystalline silicon 103 is then deposited over the vias 101a and 102a so as to contact the titanium nitride exposed by or formed in these vias as well as over the oxide between these two vias so as to extend between these two vias over the region 105 between strip 101 and strip 102. This layer of polycrystalline silicon 103 can in fact overlap portions of the underlying silicide and oxide sandwich outside of vias 101a and 102a, as shown by the annular band of material 103a surrounding alternative via 104. Alternate via 104 removes a thin layer of the thicker oxide over the semiconductor substrate between vias 101a and 102a as well as the oxide over vias 101a and 102a. Electrical contact to polycrystalline silicon 103 is made from silicide strips 101 and 102 (typically titanium silicide) through the electrically conductive titanium nitride formed over the top surface of strips 101 and 102. Polycrystalline silicon 103 contacts this titanium nitride in vias 101a and 102a respectively. The portion of polycrystalline silicon layer 103 extending across the distance 105 on the oxide formed on the wafer between silicide strips 101 and 102 has a length d which remains constant despite further high temperature processing of the wafer. Indeed, the titanium nitride in vias 101a and 102a is electrically conductive but serves as a barrier to the diffusion of impurities in strips 101 and 102 from these strips into polycrystalline silicon 103. Thus the resistance of the load resistor 106 is given by the length d, the width W and the thickness (not shown in FIG. 1b) of polycrystalline silicon 103. The length d of this resistor remains constant despite subsequent high temperature processing of the wafer. Accordingly, a load resistor is provided which has a resistance which is predictable and reproducible and which is controlled by the distance d representing the pitch between silicide strips 101 and 102. Distance d can be as short as is feasible using semiconductor processing techniques and thus typically will be one micron or less in highly dense circuits. Tests have shown that the distance d can be as little as 0.9 microns and still yield a satisfactory load resistance. However, sufficient tests have not been run to determine the bottom limit on distance d and thus it is not known at this time the minimum value of distance d which will still yield a satisfactory load resistor in accordance with the teachings of this invention.

Figure 2:
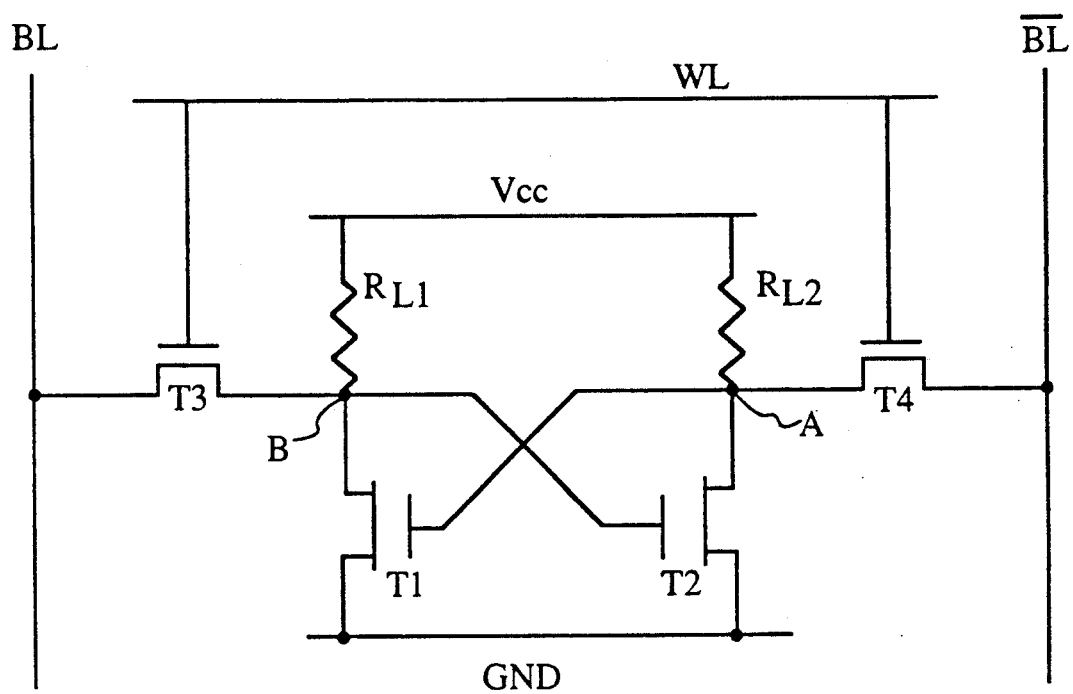
FIG. 2 shows a circuit schematic of a single CMOS SRAM cell utilizing the load resistor of this invention.

FIG. 2 illustrates a circuit schematic of a static RAM cell utilizing the load resistors $R_{L1}$ and $R_{L2}$ fabricated in accordance with this invention. In the cell of FIG. 2 transistor T2 if on, results in the voltage on node A being at approximately ground while the voltage on node B is approximately at Vcc. The current through $R_{L2}$ should be nano-amps if $R_{L2}$ is a high value such as 100 giga-ohms (corresponding to $100 \times 10^9$ ohms). If the voltage on node A is low, this low voltage is detected at $\overline{B1}$ when pass transistor T4 is turned on in a well-known manner by applying a high level signal to the word line WL. If T1 is conducting, then the voltage on node B is low, that is approximately at ground. Transistor T2 is OFF because the voltage on node B is low and the voltage on node A must then be high.

Figure 3A:
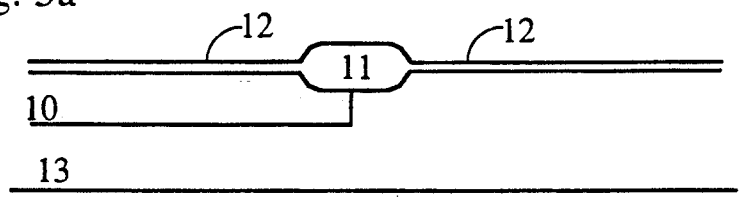
FIG. 3a–3k illustrate a number of intermediate forms of the structure of this invention during various stages of the manufacture of the load resistor of this invention.

Referring to FIG. 3a, the method of forming a MOS field effect transistor of a CMOS integrated circuit according to this invention begins using well-known techniques to form N and P wells 10, and field and gate oxidation areas 11 and 12 respectively on doped silicon substrate 13. Gate oxide 12 is typically 180 Å thick.

Figure 3B:
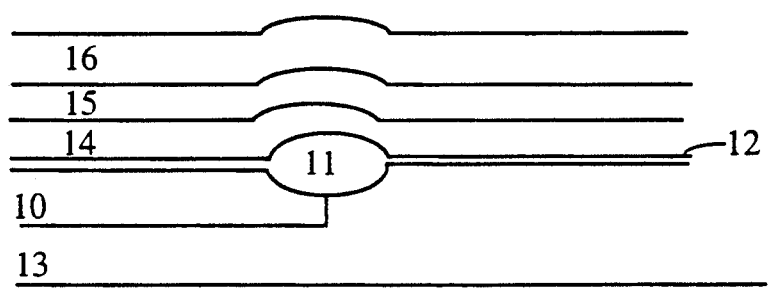

Referring to FIG. 3b, a layer 14 of polysilicon about 3000 Å thick is formed by low pressure chemical vapor deposition (LPCVD) and doped typically by ion implantation can also be used, with N-type impurities to achieve a suitable sheet resistance, typically 50 ohms per square. The doped polysilicon will function as a gate in the complete MOSFET device. First level interconnects, (not shown) usually located in the periphery of a memory array, can also be formed from this layer of polysilicon. Next a thin, 150 Å oxide layer 15 is thermally grown on the polysilicon. A layer 16 of silicon nitride about 1800 Å thick is next formed on oxide layer 15 by LPCVD.

Figure 3C:
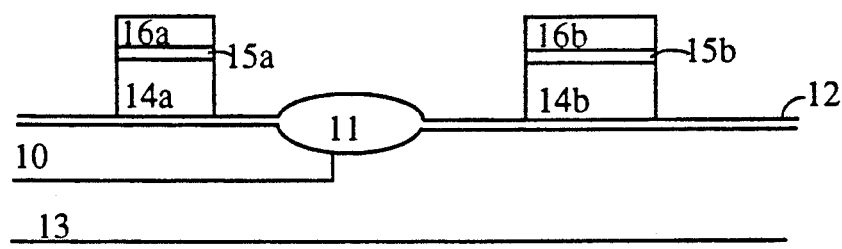

Referring to FIG. 3c, the polysilicon gates 14a, 14b are defined by well-known photo-masking and sandwich etching techniques. The sandwich etch is carried out in a LAM 490. The anisotropic sandwich etch includes a $SF_6$ plasma etch of the silicon nitride layer 16 and silicon oxide layer 15 and a subsequent anisotropic $Cl_2$/He plasma etch of the polysilicon to form polysilicon gates 14a and 14b covered by layers 15a, 15b and 16a, 16b.

Figure 3D:
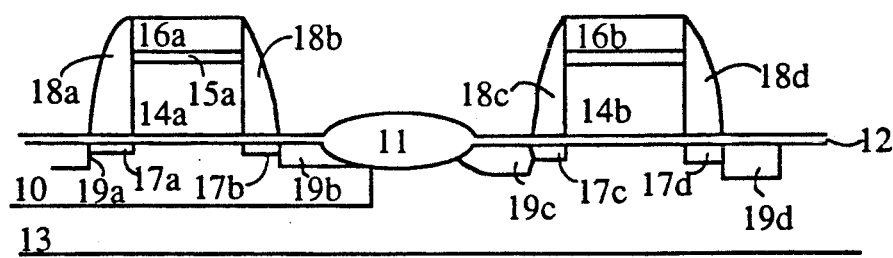

Well known ion implantation techniques are next used to 12 form both N- and P- type lightly doped drain (LDD) implants 17a, 17b, 17c, 17d (FIG. 3d) so that the LDD implants have a conductivity type that is opposite to that of the well 10 or the substrate 13 if no well is present. Typically, the impurity concentration of the LDD implants is about $1.8 \times 10^{13}$ dopant atoms per cubic centimeter. Chemical vapor deposition of a silicon oxide layer using TEOS (tetraethylorthosilicate (ethyl silicate)) at approximately 350°–400° C. followed by reactive ion etching forms gate sidewall spacers 18a, 18b, 18c, 18d of silicon dioxide which are approximately 4000–4200Å thick. A layer of oxide 100 Å thick (not shown) is thermally grown at approximately 800° C. to cap the source and drain regions and to densify the spacer oxide 18a–18d. N+ and P+ type source and drain regions 19a, 19b, 19c, 19d are then formed by well known masked ion implantation so that the dopant concentration is typically $3 \times 10^{15} - 5 \times 10^{15}$ dopant atoms per cubic centimeter in these regions.

Figure 3E:
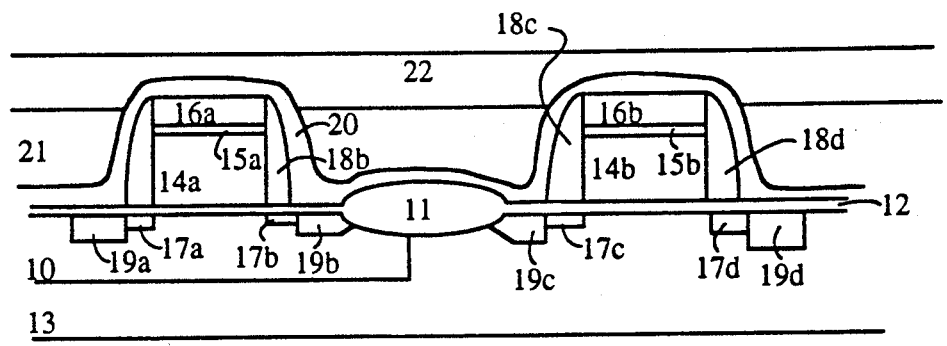

Gate contact regions are defined as described below. Referring to FIG. 3e, chemical vapor deposition of a silicon oxide layer 20, 1100 Å thick, is followed by annealing of the layer at 875° C. for 30 minutes in a nitrogen atmosphere.

The wafer is then coated with a standard Novolak based positive photoresist available from Shipley which tends to planarize the wafer, and is then baked. The photoresist 21 is blanket etched by oxygen plasma in plasma etcher AME 8115 until the oxide 20 covering the gate region is visible. A second bake of resist layer 21 at 150° C. for approximately 30 minutes hardens the resist 21 and makes it unreactive in subsequent steps. A second layer of the same positive photoresist 22, to be used with a dark field mask, is applied over the first layer 21.

Figure 3F:
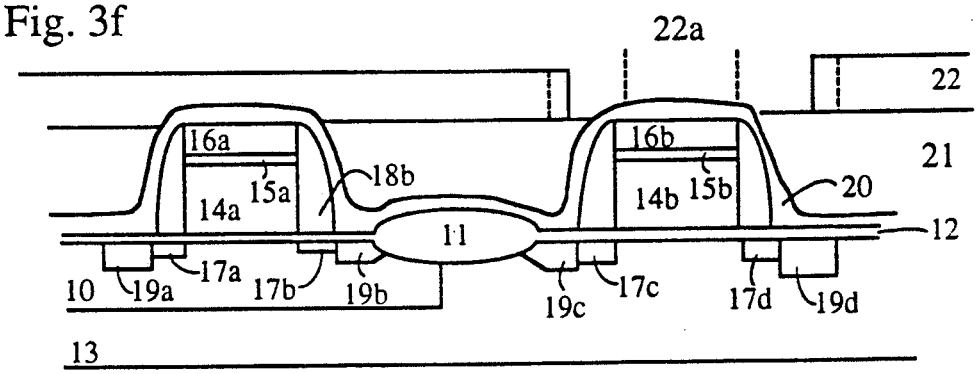

Next an opening is formed through oxide 20, nitride 16b and oxide 15b to allow electrical contact to be made to gate 14b. The polysilicon isolation mask used for this purpose to expose the gate 14b can have a contact size extending beyond the gate, thereby permitting a looser alignment tolerance. An approximation of the variable position of the contact opening to gate 14b due to alignment tolerances for the mask is shown by the dashed lines in FIG. 3f. The presence of the first photoresis 21 prevents exposure of the source and drain regions 19c,d during etching of the oxide layers 20 and 15b and silicon nitride layer 16b to expose the gate 14a, even in the event of worst case alignment of the mask. In this way electrical contact to the gate 14b can be made over, the active channel region of the transistor under gate 14b without causing a short circuit between the source or drain 19c,d and the gate 14b.

Figure 3G:
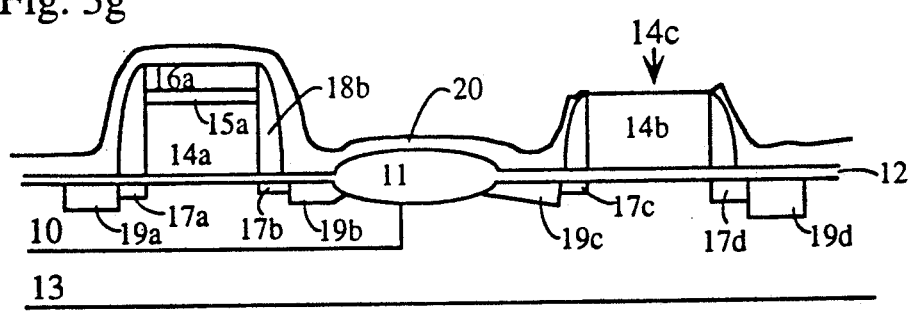

A multi-step etch is conducted to expose the gate contact. First, the oxide 20 is removed in the area exposed by the opening 22a in resist layer 22 with a dry plasma etch using $C_2F_6$/$CHF_3$ in a 25:12 ratio. Secondly, 1200–1500 Å of the silicon nitride layer 16b is removed by a $CF_4$ plasma etch. However, $CF_4$ etches all exposed materials at approximately the same rate to help create a smooth profile above gate 14b and causes a step in the oxide 18c, 18d at the interface of the oxide 18c, 18d and the first layer 21 of photoresist. Next, complete removal of both photoresist layers 21, 22 is followed by a standard wet phosphoric acid etch with a 50 to 1 selectivity toward silicon oxide which (i.e., phosphoric acid etches silicon nitride fifty times more rapidly than silicon oxide) which removes the remainder of nitride layer 16b. Finally, a blanket $CF_4$ plasma etch removes 150 Å thick oxide layer 15b and decreases the height of the oxide step in oxide 18c, 18d on the sides of gate 14b to produce the polysilicon gate contact 14c shown in FIG. 3g. A process using only dry etchants for exposing the gate contact is also feasible.

Figure 3H:
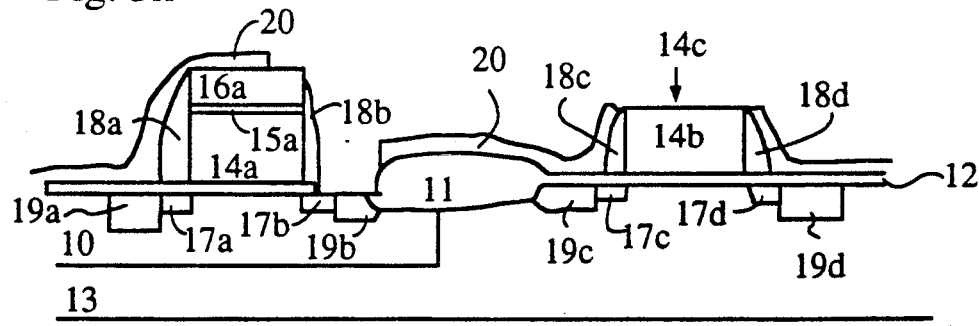

Referring to FIG. 3h, contacts to the source and drain $C_2F_6$/$CHF_3$ plasma etch of the oxide 20 removes only 10 to 20% of spacer oxide 18a, 18b because spacer oxide 18a, 18b is significantly thicker than oxide 20. The silicon nitride layer 16a protects the gate 14a after some portion of the oxide 20 covering the gate is removed. With spacer oxide 18a, 18b and protective silicon nitride layer 16a intact on gate 14a, source and drain contact metallization deposited later can overlap the gate without causing a short circuit between the source and drain 19b and the gate 14a.

The plasma oxide etch is followed by a backside etch which exposes pure silicon on the back side of the substrate 10. This exposure allows the temperature of the substrate 10 to be more closely monitored and controlled in subsequent processing steps. The backside etch is conducted in three steps. The first step using a 12:8 ratio of $CHF_3$/$SF_6$ in helium is followed by a second step using only $SF_6$ in : helium. The third step uses 20:8 $CHF_3/SF_6$, also in helium.

Figure 3I:
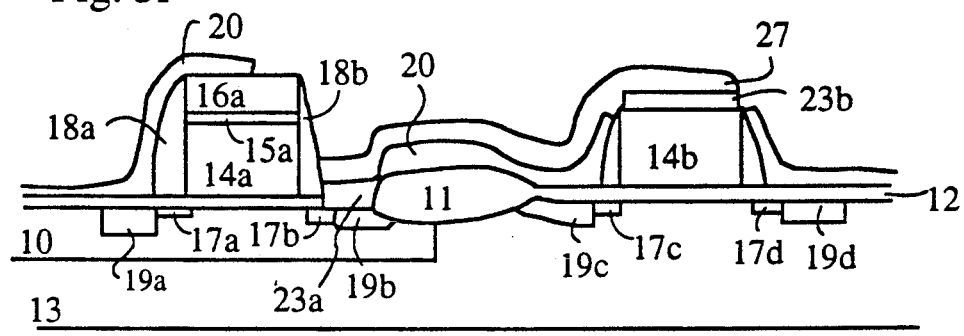

Referring to FIG. 3i, the silicon exposed by the source, drain and polysilicon gate contacts and the interconnects (not shown) are silicided by depositing a layer of sputtered titanium about 700 Å thick and using rapid thermal annealing at 700° C. in a $N_2$ atmosphere to form a layer of TiSi coated by a thin layer of titanium nitride. The rapid thermal annealing process involves quickly heating the substrate to a predetermined temperature, holding the substrate at that temperature for 30 seconds and then returning it to its original temperature. The substrate can reach the predetermined temperature as quickly as 15 seconds The rapid thermal model ALP-5500. The unreacted titanium is stripped from the substrate's surface with a 5:1:1 solution of water, hydrogen peroxide and ammonium hydroxide which also attacks and removes the titanium nitride layer. A second rapid thermal annealing step at 900° C. for 30 seconds in an atmosphere of ammonia converts the TiSi to the stable silicide $TiSi_2$ layer 23a, 23b, coated by a thin layer of titanium nitride (not shown). In this way, areas of titanium silicide are selectively formed. For instance, the gate is silicided only at regions which will contact the subsequently formed local interconnects because these are the only gate regions exposed by previous processing steps.

Of importance, the silicided layer 23a, 23b can protect the underlying source, drain and gate regions and the interconnects during later processing steps, particularly the formation of local interconnects to be formed from a second polysilicon layer.

Local interconnects are formed from a second layer of polysilicon about 700 Å thick which is deposited by LPCVD in a well-known manner. However, before the wafers are inserted into the reactor, the reactor temperature is lowered to 150° C. The reactor chamber is evacuated and backfilled with an inert gas before the temperature is raised so as to lessen the wafers contact with oxygen at high temperatures. Well-known masking and etching processes define the local interconnects. Use of an isotropic $SF_6/O_2$ plasma etch diminishes the necessity of overetch. Because the etch is selective to titanium silicide, the underlying titanium silicide layer 23a, 23b prevents damage to the source, drain and gate contacts and the first layer interconnects formed from the first polysilicon layer during the etch, therefore, the local interconnects are not required to completely overlap these regions. Layer 23 also acts as an etch stop so that the etchant will not remove the polysilicon gate or first layer interconnects during overetching of the local interconnects.

Next a 500 Å layer of sputtered titanium is deposited on the substrate. Rapid thermal annealing at 640° C. in a nitrogen atmosphere for 60 seconds forms titanium silicide $TiSi_x$ local interconnects 27 encapsulated by a thin titanium nitride film. The unreacted titanium and the titanium nitride film are stripped from the surface with a solution of 5:1:1 water, hydrogen peroxide and ammonium hydroxide to give the structure shown in FIG. 3i.

Figure 3J:
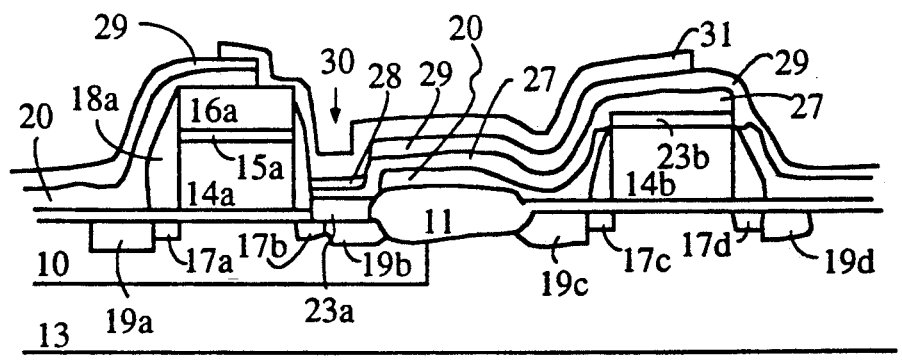

Referring to FIG. 3j, a 500 Å thick layer of oxide is deposited from a mixture of silane, nitrous oxide and nitrogen at approximately 400° C. to act as an isolation layer 29. Masking and a standard $CHF_3/O_2$ plasma oxide etch are used to open load resistor vias 30 to selected regions of local interconnects 27. Rapid thermal annealing at 850° C. for 30 seconds in a nitrogen atmosphere converts the $TiSi_x$ of the local interconnects to $TiSi_2$ to create low resistance interconnects. A thin titanium nitride film 28 forms on the regions of the local interconnects exposed by vias 30. Titanium nitride is a good electrical conductor but a barrier to dopant diffusion. This barrier will prevent dopants from diffusing into the polysilicon resistors formed by subsequent processing steps.

A third layer of polysilicon 700 Å thick, which will constitute the resistors, is deposited in a well-known manner by LPCVD. Masking and etching again using an isotropic $SF_6/O_2$ plasma etch define resistors 31 as shown in FIG. 3j. Dopant implantation to reduce the resistance of the resistors is possible.

Figure 3K:
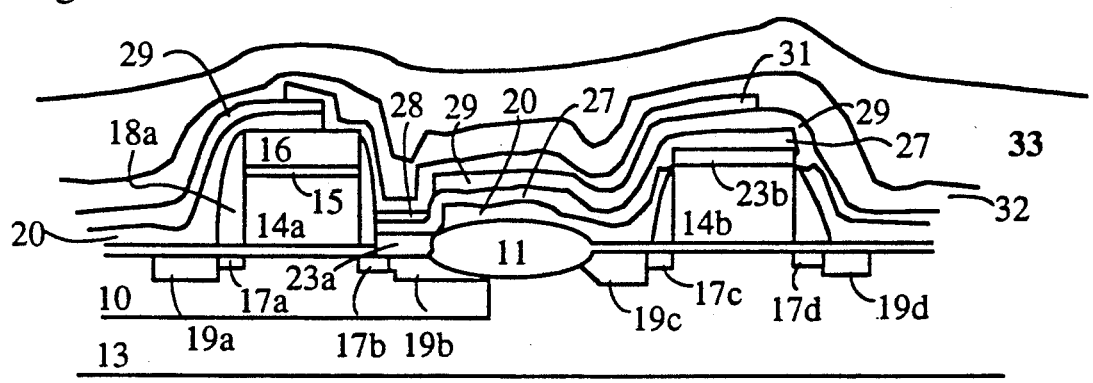

Referring to FIG. 3k, a layer 32 of oxide 1200–1500Å thick is deposited from a mixture of silane, nitrous oxide and nitrogen at approximately 400° C. A doped boron-phosphorous glass 33 which acts as an insulation layer is deposited over oxide 32 in a manner similar to oxide 32 but with the addition of diborane and phosphine to the starting gases. The glass 33 is flowed at 800° C. for 30 minutes to form a more level surface. Oxide layer 32 prevents diffusion of boron and phosphorus from boron-phosphorus glass 33 to resistors 31.

Standard fabrication techniques are used to complete the product.

Figure 4A:
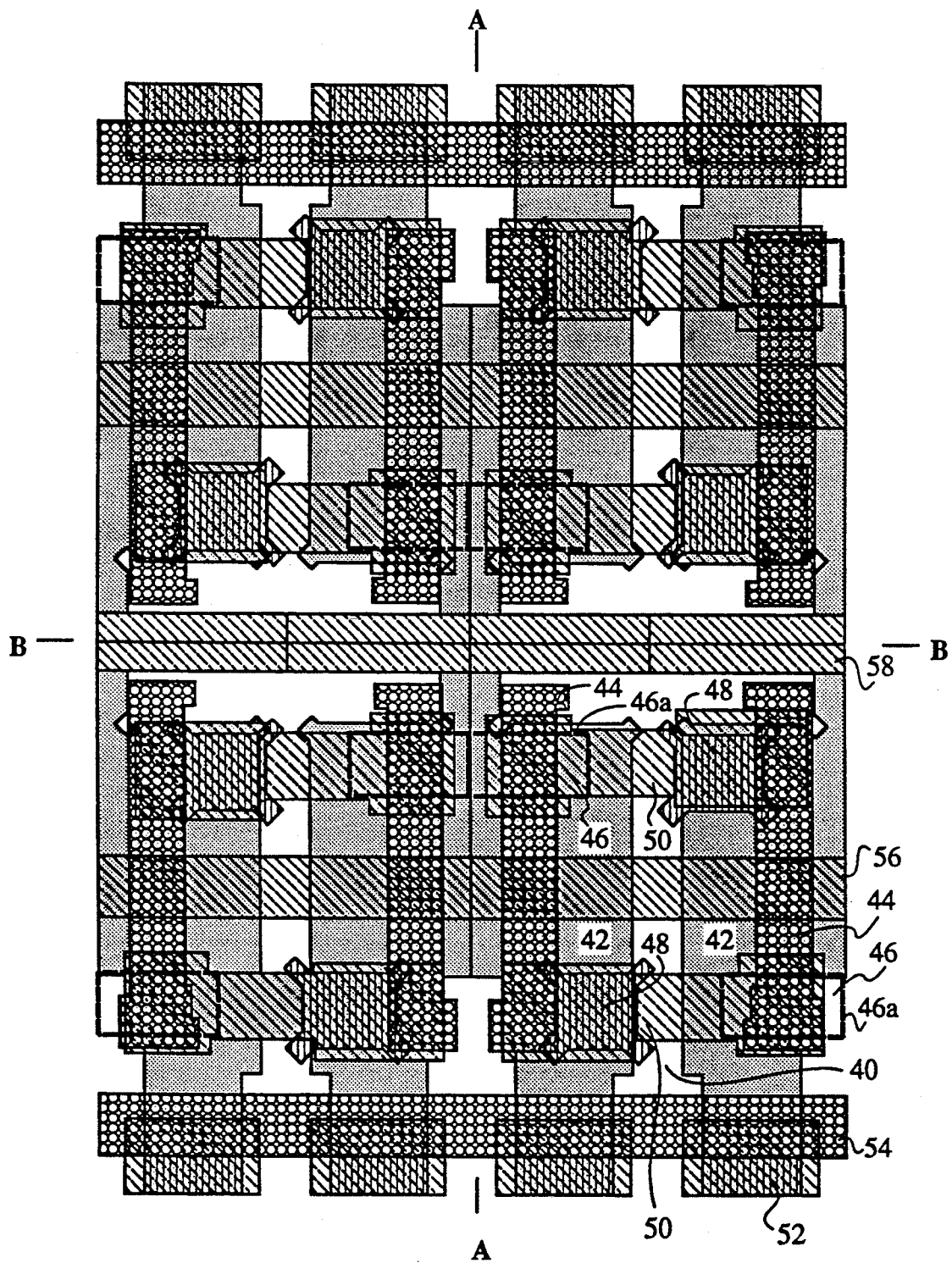
FIGS. 4a and 4b illustrate in plan view the compact nature of four CMOS SRAM cells utilizing the load resistor of this invention.
Figure 4B:
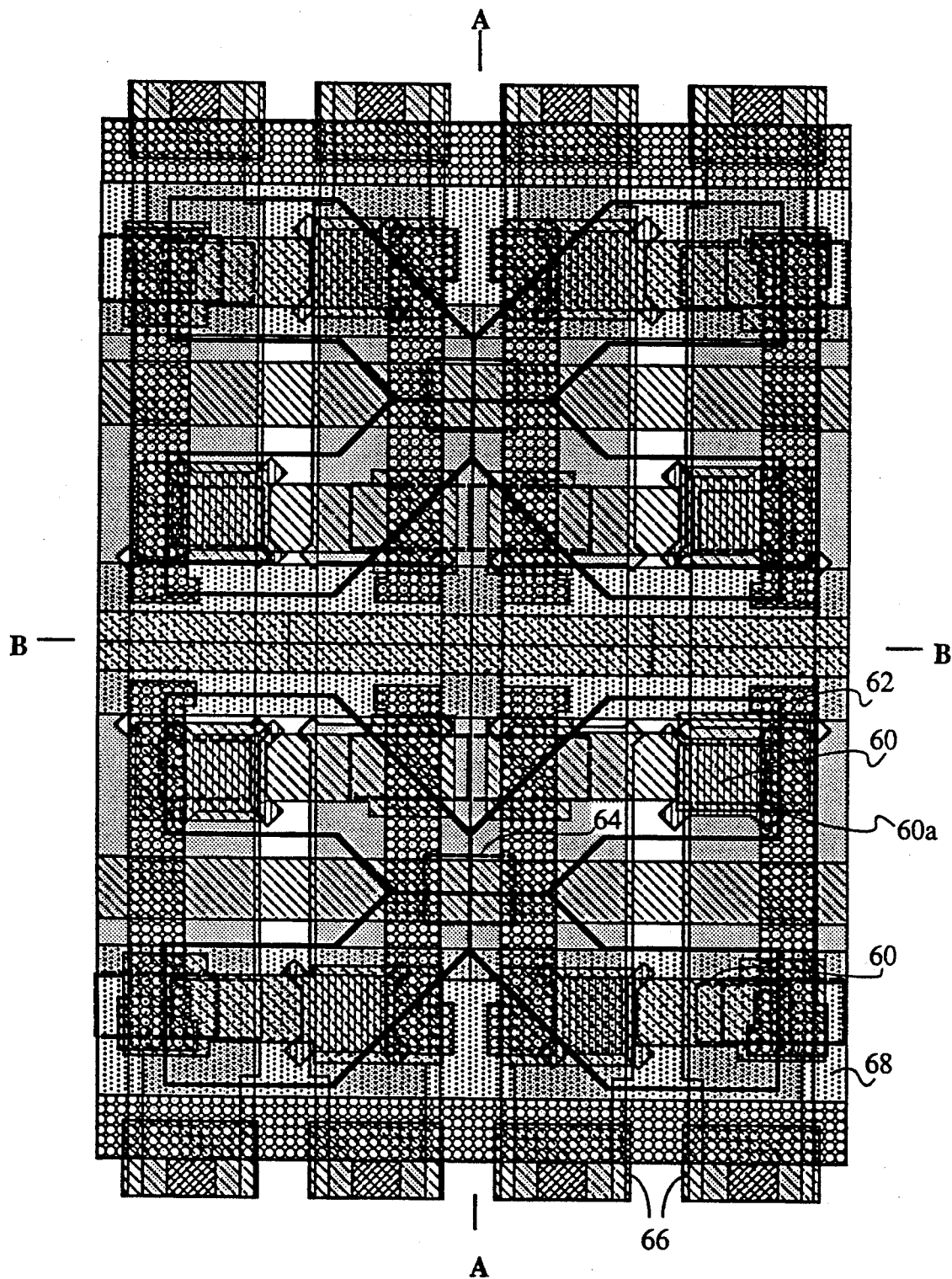

FIGS. 4a and 4b show the layout of a four cell CMOS 100 SRAM memory using this invention. A key illustrating which materials are symbolized by which shading types is also provided as FIG. 4c. Referring to FIG. 4a, which shows only some of the cell components for clarity, each cell occupies one quadrant as divided along lines A—A and B—B. The cell dimensions, only 6×9 microns, illustrate of the small cell size achievable according to this invention. Reference numbers 40 and 42 indicate the field oxide and the island or active area, respectively. The two conductive gates 44 per cell are formed from the first deposited layer of polysilicon. Contacts 46 to the polysilicon gates 44 can be wider than the gates 44 themselves as indicated by the hash lines 46a. Buried contacts 48 open to the source and drain regions can overlap but not electrically and ohmically contact gate 44 by the process described above. To form the cross coupled memory cell, the circuit for which is shown as FIG. 2, each buried contact 48 is electrically connected to a gate contact 46 via a conductive titanium silicide local interconnect structure 50. Other components of each cell include the bit line contact 52, the polysilicon word line 54, the silicided $V_{cc}$ 56 and the silicided ground Additional cell components are illustrated in FIG. 4b. Load resistor vias 60 are located above a buried contact 48 and overlap a gate contact 46 as indicated by the hash lines 60a. The location of the load resistors 62 is indicated by a heavy line. A via 64 to the $V_{cc}$ line 56 is opened between two cells. Vertical heavy line 66 and horizontal stripes of shading 68 show the location of connective metal lines formed by standard techniques.

Figure 4C:
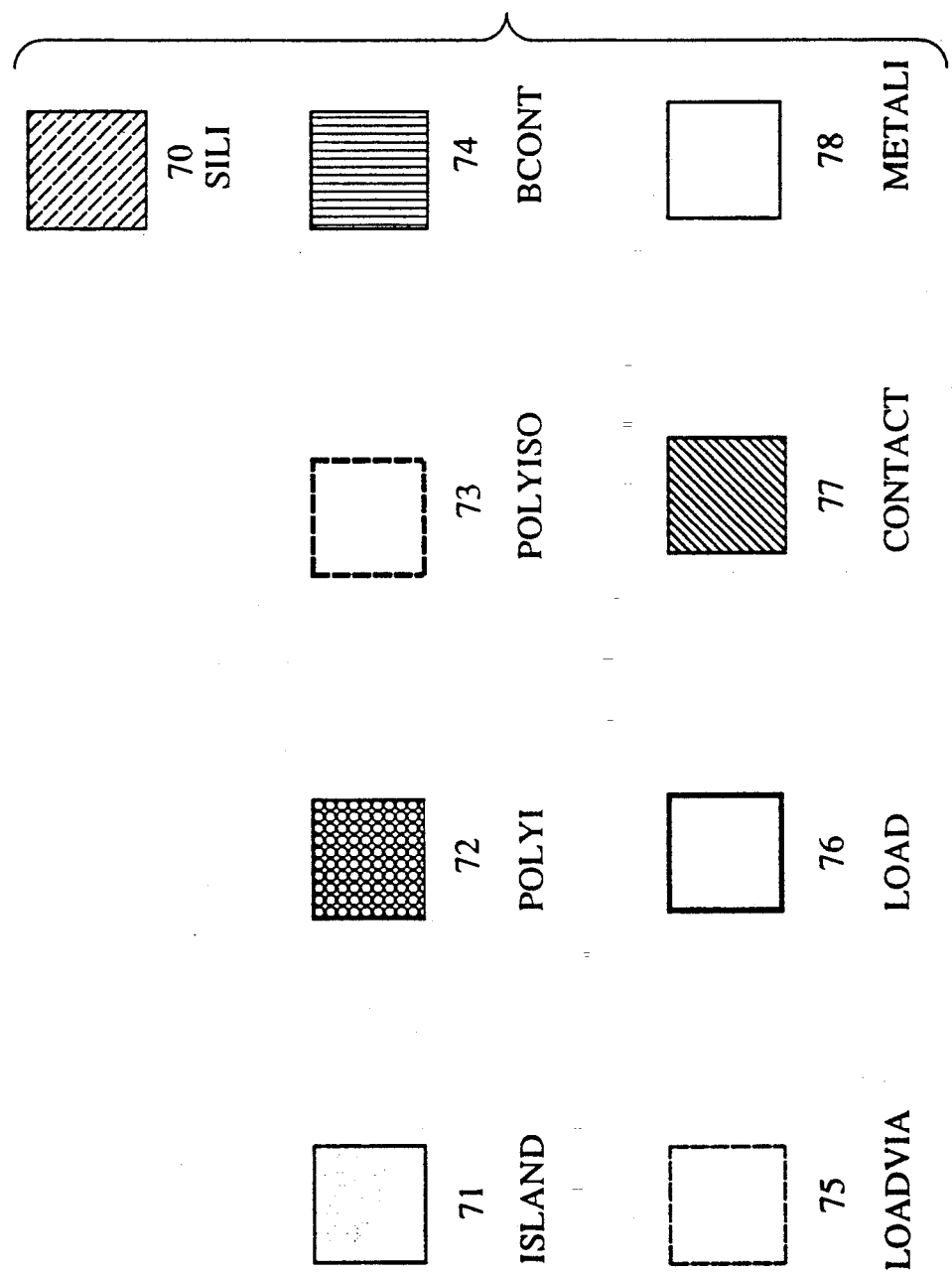
FIG. 4c illustrates which type of materials are indicated by which type of shading in FIGS. 4a and 4b.

Referring to FIG. 4c, shading 70 indicates titanium silicide layers. Shading 71 indicates an island region. Shading 72 shows cell components formed of polysilicon by the first deposition of polysilicon. Hash lines 73 outline the borders of the polyisolation mask which open the gate contact. Shading 74 indicates bit contacts. Hash lines 75 outline load resistor vias. Heavy lines 76 outline load resistors. Shading 77 indicates a contact region. Light lines 78 show metallic interconnects. Field oxide in FIGS. 4a and 4b is not shown with shading or outlines but occupies the white, unmarked portions of the cell layout.

Figure 5:
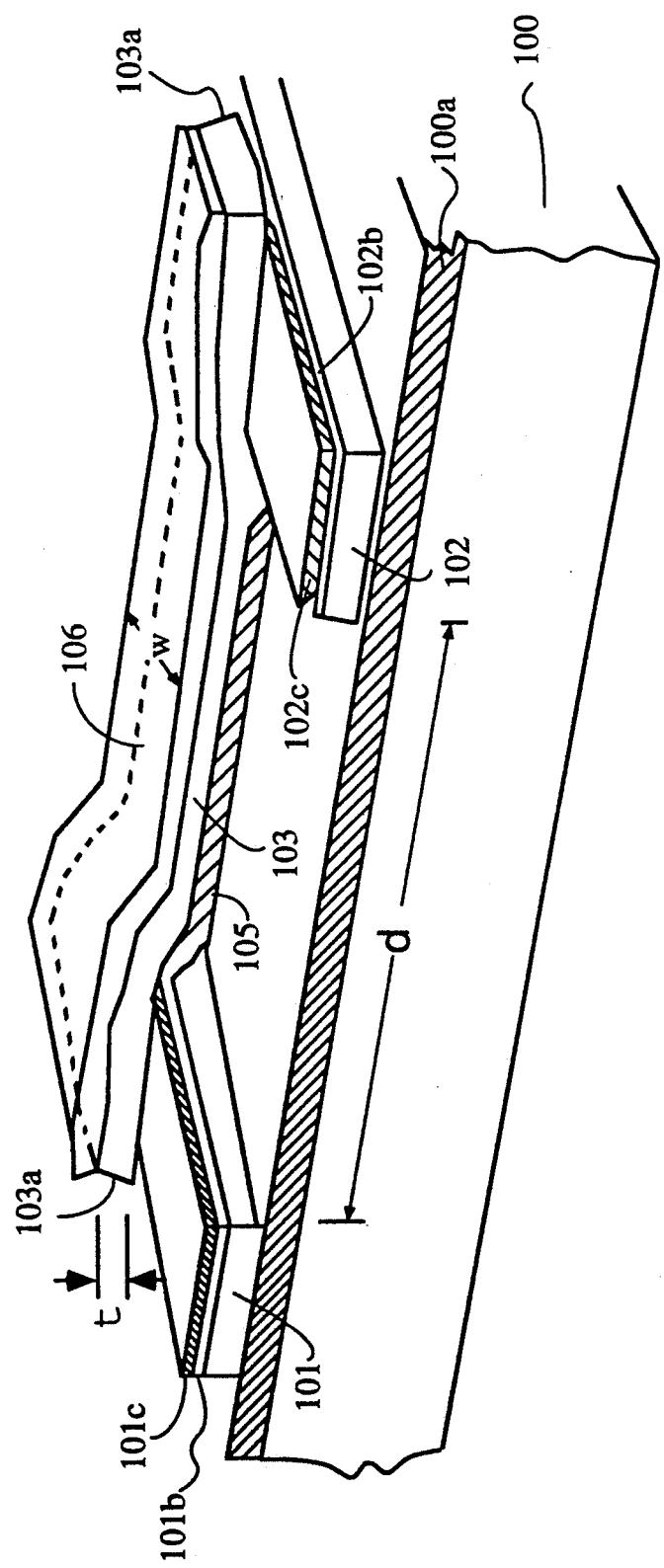
FIGS. 5 and 6 show an isometric cut-away view of the load resistor structure of this invention.

Shown in FIG. 5 is an isometric view of one load resistor structure made in accordance with the invention. A portion 100 of a semiconductor substrate has formed on it a layer of silicon dioxide 100a. Formed on top of the oxide 100a are two silicide strips 101 and 102. These strips are separated as shown by the distance d. Formed on the top surfaces of titanium silicide strips 101 and 102 are sandwiches of titanium nitride 101b, 102b and silicon oxide 101c, 102c. The structure shown in FIG. 5 illustrates silicide strips 101 and 102 formed by completely converting two polycrystalline silicon strips into a selected silicide covered by a nitride, preferably titanium silicide and titanium nitride. In practice, however, strips 101 and 102 can alternatively comprise a composite of polycrystalline silicon overlain by a selected silicide such as titanium silicide and titanium nitride can be formed only on those portions of the strips exposed by vias 101a and 102a.)

Figure 6:
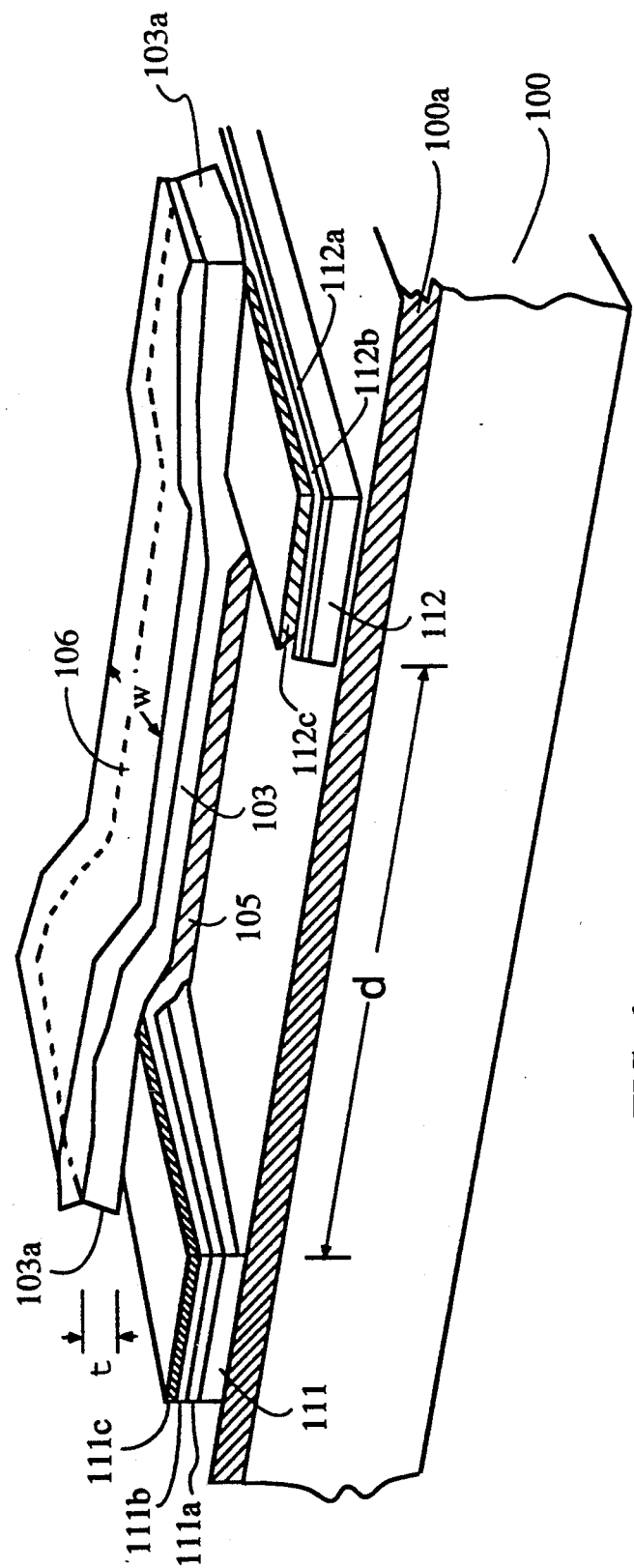

Referring to FIG. 6, in forming an alternative embodiment in which the polysilicon strips are completely overlain with a layer of titanium silicide and titanium nitride, first a titanium silicide layer 111a is formed from the top portion of polycrystalline silicon strip 111 by placing titanium on top of strip 111 and heating the wafer to approximately 900° C. in a nitrogen or ammonia atmosphere. As a result of this heating, a layer of titanium nitride 111b is formed on the titanium silicide 111a formed from the top portion of polycrystalline silicon strip 111. Similarly and simultaneously a titanium silicide layer 112a is formed from the top portion of polycrystalline silicon 112 and a titanium nitride layer 112b is formed on top of titanium silicide layer 112a during the heating of the wafer in the same nitrogen or ammonia atmosphere to form the titanium silicide.

As stated above, the titanium nitride layer 111b, 112b forms an excellent electrical conductor, but at the same time forms a barrier to the diffusion of the impurities or dopants within strips 111 and 112. Following the formation of the titanium nitride layers 111b and 112b, a layer of oxide 111c and 112c is formed on the titanium nitride 111b and 112b and oxide 107 (not shown) is formed on the oxide 100a which has previously been formed on semiconductor substrate 100. The oxide layer 111c, 112c is then etched to form vias (corresponding to vias 101a and 102a in FIG. 1b) and a polycrystalline silicon sheet 103 is deposited over the surface of the wafer. Alternatively, one via 104, as shown in FIG. 1b, can be etched through oxide 111c, 112c and 107. In either case, the portions of polycrystalline silicon sheet 103 which contact the titanium nitride 111b and 112b through the vias 101a and 102a (FIG. 1b) or through via 104 (also FIG. 1b) provide the conductive contacts to the ends of the resistive structure to be formed from polysilicon 103. The polycrystalline silicon 103 is then masked with a photoresist 106 to leave photoresist over only that portion of the polycrystalline silicon layer 103 to be retained as the high resistance load resistor structure. The portion of polycrystalline silicon layer 103 not covered by photoresist 106 is then removed, typically by a dry etch. Then the remaining polycrystalline silicon layer 103 functions as the high resistance load resistor. This layer 103 has a thickness t, a length d and a width w which determine the resistance of this structure.

The resistance of polycrystalline silicon layer 103 can vary over a wide range, typically from 10 giga-ohms to several hundred giga-ohms, and not materially affect the operation of the circuit. While the current which flows through the load resistor 103 formed from polycrystalline silicon 103 will increase directly as the resistance of this load resistor decreases, the currents which are typically drawn through this load resistor are in the pico-amp range. Thus the total current through a 256K memory cell utilizing the load resistor of this invention is still in the microamp range in the worst case, an acceptable current range for this kind of product.

While the resistance of the load resistor of this invention is in the giga-ohms range at room temperature, as the resistor heats up, its resistance drops. Thus a resistor which has a value of 100 giga-ohms at room temperature can drop to 10 giga-ohms at the maximum operating temperature of the circuit thereby resulting in a 10 times current increase. Thus the current through a static RAM using the load resistance of this invention can be in the microamp range or even in the milliamp ramp depending upon the specifications of the product and the application to which the product is put.

This invention also allows for load resistors having resistance values above 100 giga-ohms. These high resistance values make possible the fabrication of static random access memory cells with very low stand-by currents.

The titanium nitride layers 111b and 112b (FIG. 6) provide a barrier to the diffusion of dopants from underlying strips 111 and 112 into polycrystalline silicon regions 103a and 103b. At the same time, titanium nitride layers 111b and 112b are electrically conductive and thus allow the load resistor 103 to be electrically contacted through strips 111 and 112.

While the above description is illustrative only, other embodiments of this invention will be obvious from this description of those skilled in the art. A particular advantage of this invention is that as the distance d becomes less than one micron the resistance of polycrystalline silicon material 103 can be satisfactorily controlled even should the wafer be subjected to subsequent high temperature processing steps.

While this invention has been described in conjunction with two embodiments, those skilled in the art will understand that the dopant barrier comprising titanium nitride 111b, 112b overlying titanium silicide 111a, 112a in the vias though which the ends 103a, 103b of the load resistor 103 ohmically contact the underlying conductive regions 111, 112 can be locally formed after the vias 101a, 102a are formed rather than formed prior to the deposition of oxide 111c, 112 and the formation of these vias.

What is claimed is:

1. A method of fabricating a load resistor in an integrated circuit, which comprises the steps of:
   providing a structure having a first portion of conducive material and a second portion of conducive material such that said first and second portions are separated from each other by a selected distance;
   forming an insulator over said first and second portions;
   forming a first opening in said insulator to expose at least a part of said first portion, and forming a second opening in said insulator to expose at least a part of said second portion;
   after said step of forming said openings, reacting at least a part of the conductive material of said first portion, which material is exposed by said first opening, with a non-metal-containing substance to convert at least some of the exposed conducive material of said first portion to a different material which is an electrically conducive dopant diffusion barrier; and placing contiguous polycrystalline silicon material on said insulator and over at least parts of said first and second portions of conductive material such that one portion of said polycrystalline silicon material is in ohmic contact through said diffusion barrier material with said first portion of conductive material and another portion of said polycrystalline silicon material is in ohmic contact with said second portion of conductive material.

2. The method of claim 1 wherein said placing step is performed so that the portion of high resistivity of said polycrystalline silicon material extends form said first portion of conductive material to said second portion of conducive material.

3. The method of claim 1 wherein:
said first portion comprises:
  doped silicon; and
  titanium silicide overlaying said doped silicon; and
said reacting step comprises the step of heating in a nitrogen atmosphere the titanium silicide exposed by said first opening to convert at least some of the exposed titanium silicide to titanium nitride.

4. The method of claim 1 wherein: p1 said reacting step comprises the step of reacting at least a part of eh conductive material of said second portion, which material is exposed by said second opening, with said non-metal-containing substance to convert at least some of the exposed material of said second portion to a different material which is an electrically conducive dopant diffusion barrier; and
said polycrystalline silicon material is placed so that a portion of said polycrystalline silicon material is in ohmic contact with said second portion of conductive material through said diffusion barrier material obtained by said step of reaching at least a part of the conductive material of said second portion.

5. A method of forming a load resistor for use in a semiconductor integrated circuit comprising the steps of:
forming a structure comprising a first portion of conductive material and a second portion of conductive material such that said first and second portions are separated from each other by a selected distance, said first portion comprising doped silicon and titanium silicide overlying said doped silicon;

forming a layer of insulation over said structure such that said insulation covers said first and second portions of conductive material and the portion of said structure between said first and second portioned of conductive material;

forming a first opening over said first portion through said insulation, and forming a second opening over said second portion through said insulation;

after said site of forming said openings, reacting with nitrogen at least a part of the titanium silicide exposed by said first opening to form titanium nitride on said first portion; and forming contiguous polycrystalline silicon material on said structure such that one portion of said polycrystalline silicon material is in ohmic contact through said titanium nitride with said first portion of conductive material and another portion of said polycrystalline silicon material is in ohmic contact with said second portion of conductive material.

6. The method of claim 5 wherein:
said step of forming a structure comprises the step of forming an interconnect overlaying the doped silicon of said first portion, said interconnect comprising a layer of titanium silicide which provides at least some of the titanium silicide exposed by said first opening and reacted with nitrogen; and
said first opening exposes a part, but not all, of said titanium silicide layer.

7. A method of fabricating an integrated circuit having a resistor, comprising the steps of:
providing a structure comprising:
  a portion of doped silicon;
  a conductive line electrically contacting said portion of doped silicon, said lie comprising a layer of metal silicide;
  an insulator over said conductive line; and
  a portion of conductive material spaced from said portion of doped silicon and from said conductive line;
opening a via in said insulator to expose a region of said conducive line;
after said step of opening said via, heating in a nitrogen atmosphere at least a part of the metal silicide of said exposed region to convert at least some of said exposed metal silicide to a metal nitride; and
forming a silicon resistor over said insulating layer, said resistor contacting said metal nitride, said metal nitride preventing diffusion of dopant from said portion of doped silicon into said resistor.

* * * * *